United States Patent [19]
Schoenmakers

[11] Patent Number: 5,323,263
[45] Date of Patent: Jun. 21, 1994

[54] OFF-AXIS CATADIOPTRIC PROJECTION SYSTEM

[75] Inventor: Wijnand P. Schoenmakers, Belmont, Calif.

[73] Assignee: Nikon Precision Inc., Belmont, Calif.

[21] Appl. No.: 12,105

[22] Filed: Feb. 1, 1993

[51] Int. Cl.$^5$ .................................................. G02B 17/08
[52] U.S. Cl. .................................. 359/366; 359/365; 359/364
[58] Field of Search ........................ 359/366, 365, 364

[56] References Cited

U.S. PATENT DOCUMENTS

| | | | |
|---|---|---|---|
| 2,585,009 | 2/1952 | Henroteau | 177/319 |
| 2,664,026 | 12/1953 | Kavanagh | 88/57 |
| 3,062,101 | 11/1962 | McCarthy | 88/57 |
| 3,455,623 | 7/1969 | Harris | 350/55 |
| 3,536,380 | 10/1970 | Ferguson | 350/199 |
| 3,748,015 | 7/1973 | Offner | 350/55 |
| 3,821,763 | 6/1974 | Scott | 354/94 |
| 3,827,778 | 8/1974 | Wheeler | 350/55 |
| 4,241,390 | 12/1980 | Markle et al. | 362/299 |
| 4,293,186 | 10/1981 | Offner | 350/27 |
| 4,395,095 | 7/1983 | Horton | 350/504 |
| 4,469,414 | 9/1984 | Shafer | 359/366 X |
| 4,685,777 | 8/1987 | Hirose | 359/366 |
| 4,701,035 | 10/1987 | Hirose | 350/505 |
| 4,711,535 | 12/1987 | Shafer | 350/442 |
| 4,747,678 | 5/1988 | Shafer | 359/366 |
| 4,772,107 | 9/1988 | Friedman | 350/463 |
| 4,779,966 | 10/1988 | Friedman | 350/442 |
| 4,796,984 | 1/1989 | Wynne | 350/444 |
| 4,812,028 | 3/1989 | Matsumoto | 350/444 |
| 4,953,960 | 9/1990 | Williamson | 350/442 |
| 5,114,238 | 5/1992 | Sigler | 359/366 X |

FOREIGN PATENT DOCUMENTS 553569 5/1977 U.S.S.R. .
637772 12/1978 U.S.S.R. .

OTHER PUBLICATIONS

J. Dyson, "Unit Magnification Optical System without Seidel Aberrations", *Journal of the Optical Society of America,* vol. 49, No. 7, Jul., 1959, pp. 713-716.

Seymour Rosin, "Inverse Cassegrainian Systems", *Applied Optics,* Aug. 1968, vol. 7, No. 8, pp. 1483-1497.

Rubin Gelles, "Unobscured Aperture Stigmatic Telescopes", *Optical Engineering,* Nov./Dec., 1974, vol. 13, No. 6, pp. 534-538.

Rubin Gelles, "Unobscured-aperture two-mirror systems", *Journal of the Optical Society of America,* vol. 65, No. 10, Oct., 1975, pp. 1141-1143.

*Primary Examiner*—Eugene R. LaRoche
*Assistant Examiner*—Son Mai
*Attorney, Agent, or Firm*—Townsend and Townsend Khourie and Crew

[57] ABSTRACT

A reduction projection system characterized by large numerical aperture has an unobscured optical path without the need to resort to truncated lens elements and provides locations for field and aperture stops. The system includes a first lens group, a first double-pass component group, a first concave mirror, a second lens group, a second double-pass component group, a second concave mirror, and a third lens group. The light encounters the first double-pass component group before and after it encounters the first concave mirror. Similarly, the light encounters the second double-pass component group before and after it encounters the second concave mirror. Together, the first lens group, the first double-pass component group, the first concave mirror, and the second lens group form an intermediate reduced image of the object at an intermediate image plane. The second double-pass component group, the second concave mirror, and the third lens group form a further reduced image at an image plane.

15 Claims, 3 Drawing Sheets

RAY ABERRATIONS
MILLIMETERS

OFF-AXIS CATADIOPTRIC PROJECTION SYSTEM

BACKGROUND OF THE INVENTION

The present invention relates generally to optical projection systems, and more particularly to off-axis catadioptric (including lenses and mirrors) reduction systems such as might be useful for microlithography.

As the feature sizes on integrated circuit devices have grown ever smaller, the demands on the optical train in the microlithography system have grown ever greater. In order to achieve resolution characteristics that are commensurate with future requirements for optical systems, the numerical aperture required is in excess of the current state-of-the-art optical systems. For resolution less than 0.35 $\mu$m, a numerical aperture in excess of 0.50 is needed. The prior art, as exemplified by U.S. Pat. Nos. 4,685,777 and 4,701,035, describes reducing optical projection systems where the bulk of the optical power is developed with curved mirrors, and lenses are used to correct aberrations. The systems described in these patents have numerical apertures of 0.25 and 0.18 respectively.

In order to achieve a degree of compactness, the optical path is often folded, either by the curved mirrors or by flat folding mirrors introduced into the optical path. A number of the prior art systems incur the need to use truncated and in some cases decentered optical elements in order to avoid obscuring the path of the beam as it is reflected back. A problem with using truncated lens elements is that the elements are much more difficult to align along the optical axis, and aberrations and errors introduced by decentration and the like are significant. In the manufacturing process the requirement for maintaining contour accuracy of the optical surfaces increases the cost of the components considerably relative to that of non-truncated equivalents. A further problem with truncated optical elements occurs in the application of the system when, due to the use of a high-powered laser, optical elements are subject to increased temperatures which causes non-radially-symmetric gradients in the truncated components. This could reduce the performance of systems containing those elements considerably.

The various design problems become more challenging as the need for systems with higher numerical aperture becomes greater. Larger reflecting elements are required, adding cost and size. Moreover, there appears to be a conflict between large numerical aperture and adequate working distance (back focal length). It is also typically difficult to find space for field stop baffles or an aperture stop.

SUMMARY OF THE INVENTION

The present invention provides a reduction projection system characterized by large numerical aperture (in excess of 0.45 if desired). The system has an unobscured optical path without the need to resort to truncated lens elements and provides accessible locations for field and aperture stops and stray light baffles. The system is adapted to being constructed in modules.

In brief, a system according to the present invention includes first and second reduction stages. The first reduction stage includes a first lens group, a first double-pass component group, a first concave mirror, and a second lens group. The second reduction stages includes a second double-pass component group, a second concave mirror, and a third lens group. The light encounters the first double-pass component group before and after it encounters the first concave mirror. Similarly, the light encounters the second double-pass component group before and after it encounters the second concave mirror. Together, the first lens group, the first double-pass component group, the first concave mirror, and the second lens group form an intermediate reduced image of the object at an intermediate image plane. The second double-pass component group, the second concave mirror, and the third lens group form a further reduced image at an image plane.

The various optical elements are configured and cooperate to allow flat folding mirrors to be introduced into the path without requiring any of the other elements in the path to be truncated. The use of full diameter elements facilitates alignment, thereby keeping decentration-induced aberrations to a minimum. In a specific embodiment, a first folding mirror is introduced between the first lens group and the first double-pass component group, and a second between the second lens group and the second double-pass component group.

Sufficient clearance is maintained to permit the insertion of a field stop near the intermediate image and a variable aperture stop, which in this embodiment is associated with the second lens group. This allows control of the beam intensity, suppresses stray light, and offers an effective means for adjustment of the numerical aperture. The first double-pass component group, a single positive element in a specific embodiment, is preferably spaced from the first concave mirror so that the combination can have a relatively short focal length without requiring the mirror to have high curvature. This allows the path to the intermediate image to be shorter than would otherwise be possible. The present invention lends itself to the construction of embodiments using relatively small diameter elements. This provides cost and size benefits.

A further understanding of the nature and advantages of the present invention may be realized by reference to the remaining portions of the specification and the drawings.

DESCRIPTION OF SPECIFIC EMBODIMENTS

Figure 1:
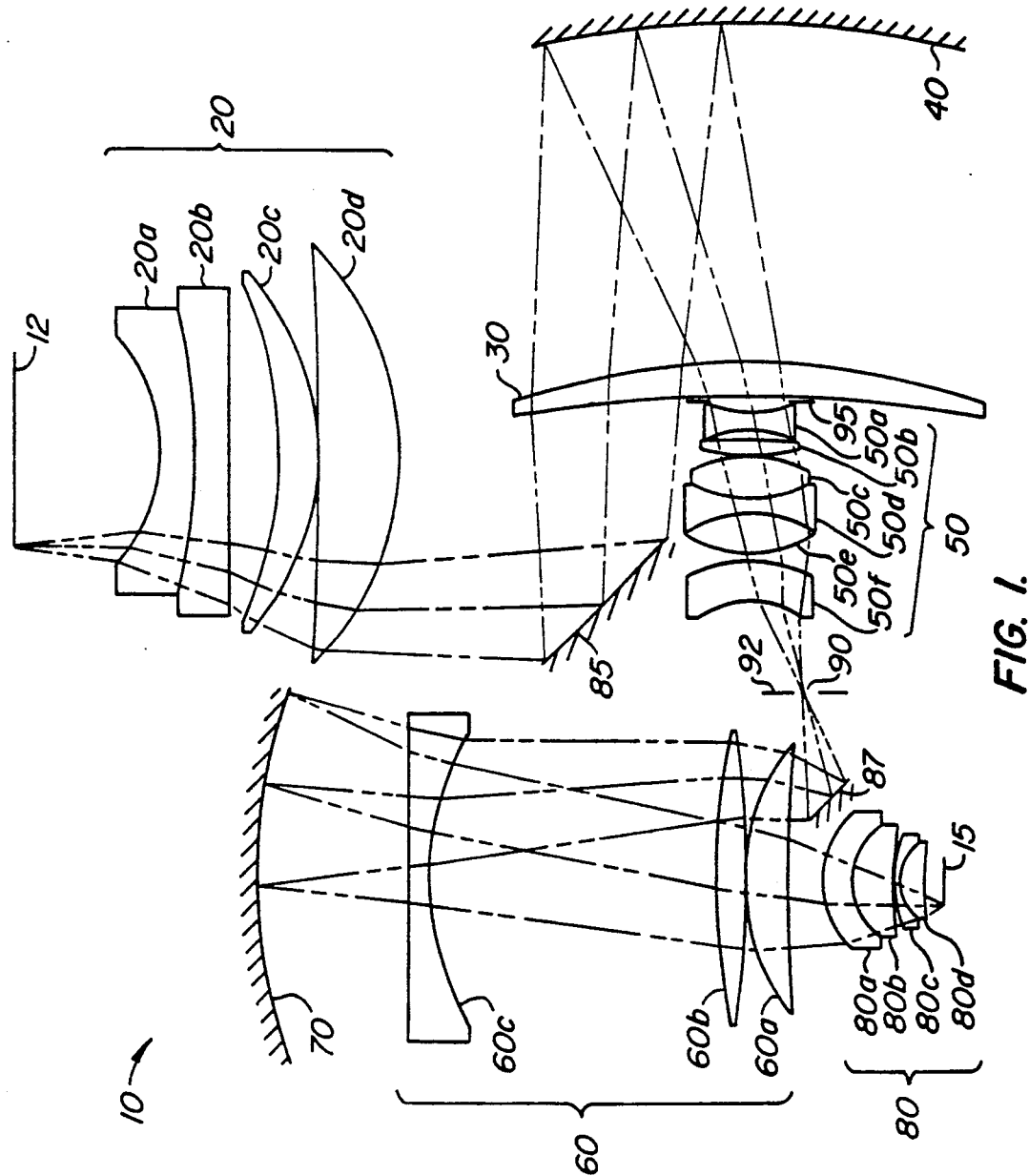
FIG. 1 is an optical schematic of a projection system according to the present invention.

FIG. 1 is an optical schematic of a specific embodiment of an off-axis catadioptric reduction system 10 according to the present invention. The system is characterized by a common optical axis. The basic function of system 10 is to produce a reduced image of an off-axis, ring-shaped field in an object plane 12 at an image plane 15. In normal operation, a reticle will be located in the object plane and a photoresist layer on a wafer to be patterned will be in the image plane.

The system includes a first lens group 20 having elements 20a–d, a first double-pass component group 30 (a single element in the illustrated embodiment), a first concave mirror 40, a second lens group 50 having elements 50a–f, a second double-pass component group 60 having elements 60a–c, a second concave mirror 70, and a third lens group 80 having elements 80a–d. In this embodiment, all the elements are centered on the optical axis and the mirrors are front surface mirrors. Table 1 provides the construction parameters for the system.

The term "mirror" as used herein is intended to include any optical element having one or more fully or partially reflective surfaces. The term "lens" as used herein is intended to include diffraction-based optical elements in addition to the widely-used refraction-based elements.

Each of the double-pass component groups is associated with one of the mirrors, and is traversed by light twice, first on the light's way toward the associated mirror, and second on the light's way away from the associated mirror. A first flat folding mirror 85 is interposed in the path between first lens group 20 and first double-pass component group 30. A second flat folding mirror 87 is interposed in the path between second lens group 50 and second double-pass component group 60. The folding mirrors are required if a compact system is desired, and one of the significant advantages of the present invention is that it allows the placement of folding mirrors without requiring that any of the lens elements be truncated.

In operation, light emerging from a point in object plane 12 encounters the first lens group, the first double-pass component group, the first concave mirror, the first double-pass component group again, and the second lens group, which cooperate as a first reduction stage to form an intermediate reduced image (not necessarily well focused) in an image region 90. A field stop 92 is preferably located in this region. The light emerging from the image region encounters the second double-pass component group, the second concave mirror, the second double-pass component group again, and the third lens group, which cooperate as a second reduction stage to form a further reduced image in image plane 15.

First lens group 20 is a weak group (positive in this embodiment) that operates to reduce the divergence of the beam, and therefore allows the first concave mirror to be smaller than it would otherwise have to be. The first lens group also operates to increase the apparent distance of the object plane from first concave mirror 40, and thus decreases the distance from the first concave mirror to the intermediate image. The first lens group also controls the telecentricity in the object space so that the full benefit of uniform illumination can be realized. The first lens group also displaces the beam from the optical axis, which contributes to a clear separation between the beam on its first pass through first double-pass component group 30 and its second pass. This makes it possible to introduce first folding mirror 85 into the optical path without occluding the beam on its return from the first concave mirror, and provides for a space for an aperture stop 95 at second lens group 50.

Recent research has indicated that it is desirable to vary the numerical aperture in accordance with the size of targets contained in the reticle. In prior art systems, the aperture stop is at or near large diameter mirrors, and is therefore a large complicated mechanism. A particular advantage of the present invention is that it provides for an accessible location for a relatively small size aperture stop.

First double-pass component group 30 has modest positive power, but is separated from concave mirror 40, and therefore allows the concave mirror to have lower power than it would otherwise have. This makes the alignment of the mirror less critical, since a higher power mirror would contribute more to aberrations due to misalignment. The separation of the two positive elements results in a shorter focal length than the two elements would have if they were close to each other. The resulting decreased focal length of the combination results in a shorter distance to the intermediate image. Double-pass component group 30 also operates to reduce the height of the incoming beam on mirror 40, thus allowing a smaller diameter mirror to be used. While having double-pass component group 30 positive provides the above-mentioned advantages, a negative group could be used. Some of the aforementioned advantages would be sacrificed, but that would not be a serious problem in a system having a smaller numerical aperture.

Second lens group 50 operates to balance the aberration introduced downstream by second double-pass component group 60. The last element (50f) in the second lens group is a low power element that is strongly curved on both its surfaces, and thus bends the beam away from the optical axis, which contributes to a clear separation between the beam on its first pass through second double-pass component group 60 and its second pass. This separation makes it possible to introduce second folding mirror 87 into the optical path. While lens group 50 is positive in the specific embodiment, a negative group (possibly in combination with a stronger concave mirror) could provide most or all of the same benefits, except for the high numerical aperture.

Second double-pass component group 60 reduces the incident height on second concave mirror 70, thus allowing a smaller diameter mirror to be used. Further, the positive group, being spaced from mirror 70 allows a lower power mirror to be used, with the same advantages discussed above in connection with the first double-pass component group and concave mirror.

Third lens group 80 provides the final focusing to produce the reduced image at image plane 15. To this end it is configured with aplanatic surfaces to produce high power without introducing higher-order aberrations. It should be noted that elements 60a and 60b of the second double-pass component group cooperate with lens group 80 to provide the final focusing, contributing to the overall power and thus relieving the requirement for strong curvatures in the third lens group. The use of elements 60a and 60b to reduce the power required in the third lens group has the further beneficial effect of increasing the back focal length so as to provide increased working distance between element 80d and the wafer surface. The working distance is preferably as large as possible (say on the order of 20 mm) to accommodate alignment and inspection equipment. The construction of the third lens group in combination with the second double-pass component group is selected to provide telecentricity at the image plane. The main advantage of this is that distortion does not vary with changes in the location of the image plane.

Figure 2A:
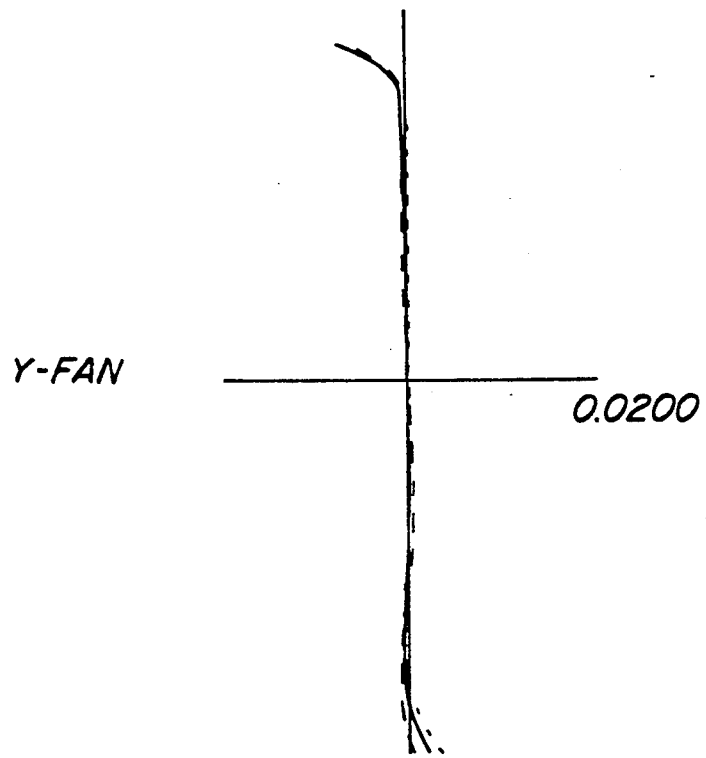
FIGS. 2A and 2B show ray aberration curves in the plane of FIG. 1 and perpendicular to the plane of FIG. 1, respectively.
Figure 2B:
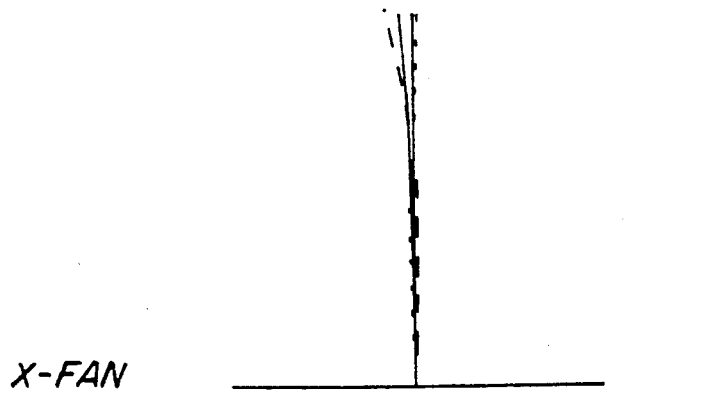

FIGS. 2A and 2B show plots of ray aberrations at a ring diameter of 25 mm as a function of beam diameter at aperture stop 95. In this context, the ring diameter refers to the diameter in the image plane. The monochromatic aberrations are shown as solid lines while the chromatic aberrations are shown as broken lines. FIG.

2A shows the aberrations in the tangential (or meridional) image plane, whereas FIG. 2B shows the aberrations in the sagittal image plane. As can be seen, chromatic as well as monochromatic aberrations are well corrected.

Figure 3:
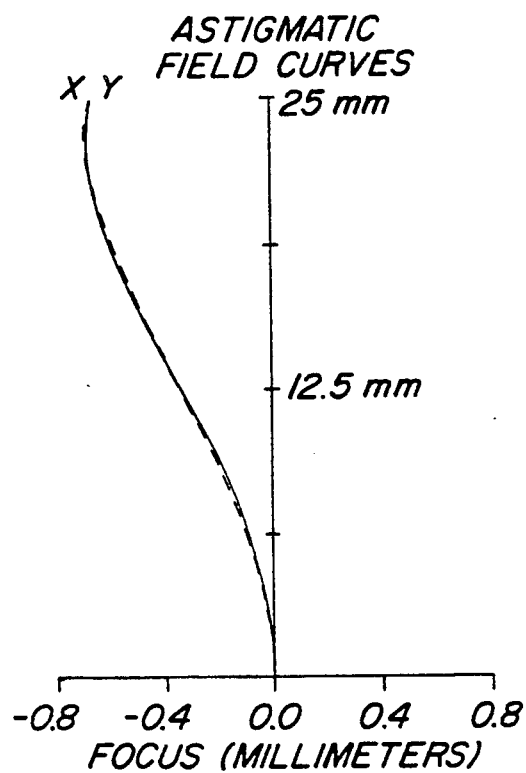
FIG. 3 shows plots of the astigmatic correction over the full image diameter.

FIG. 3 shows plots of the focal distance as a function of radial distance from the optical axis at the image plane. Light emerging from a point on the optical axis in the object plane is considered to come to a focus on the optical axis at a focal distance of zero in the image plane. The solid line illustrates the sagittal field curvature while the dashed line illustrates the tangential field curvature. The region of interest is an annular region about 25 mm from the optical axis. As can be seen, the focal displacement is essentially the same for the two orientations, and is essentially constant over this range of interest.

Figure 4:
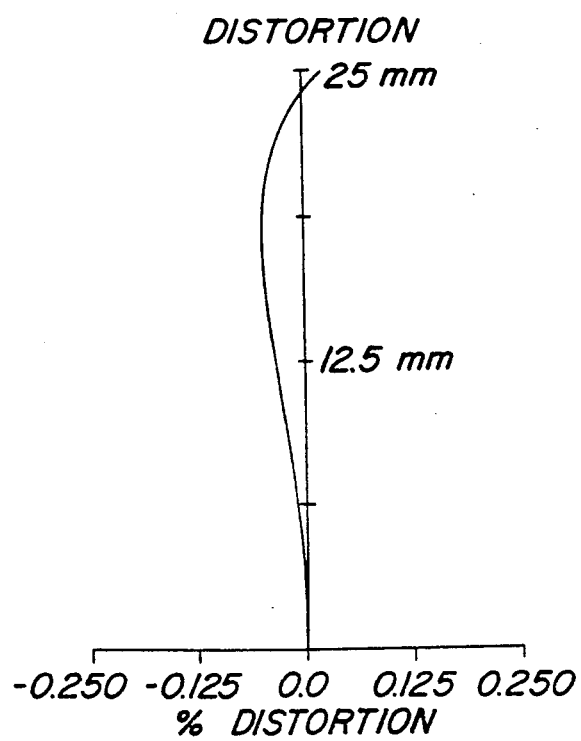
FIG. 4 is a plot of distortion over the full image diameter.

FIG. 4 shows a plot of distortion as a function of radial distance from the optical axis at the image plane. As can be seen, the distortion is zero on the optical axis, has a maximum value at a non-zero radius, but approaches zero in the region of interest.

In addition to the performance benefits of the present invention, a system in accordance therewith can be assembled and tested as separate subassemblies. In particular, first lens group 20 could be assembled as a first module; flat mirror 85, first double-pass component group 30, first concave mirror 40, and second lens group 50 could be assembled as a second module; and flat mirror 87, second double-pass component group 60, second concave mirror 70, and third lens group 80 could be assembled as a third module. Each module could be individually aligned and tested, and the three modules subsequently assembled, aligned, and tested.

In conclusion it can be seen that the present invention provides a design philosophy and implementation that allows high performance to be achieved without sacrificing ease of construction. The use of double-pass component groups in cooperation with the other components provides a significant degree of design freedom that allows high numerical aperture and large field to be achieved.

While the above is a complete description of a specific embodiment of the invention, various alternative constructions, modifications, and equivalents may be used. For example, while the particular system is characterized by a reduction ratio of 4x (magnification=0.25), which is relevant to some microlithography applications, other reduction ratios can be accommodated by the design philosophy of the present invention.

Similarly, while the present invention makes it possible to achieve very high numerical apertures (0.52 in the specific embodiment), there may be applications where such a high value is not required. In such case, relaxation of the requirement for a high numerical aperture could be exploited to achieve a high level of performance over a wider field. Put another way, the clearance between entering and exiting beams that is a hallmark of the present invention allows a trade-off between numerical aperture and field size.

Furthermore, while concave mirrors 40 and 70 are front surface mirrors in the specific embodiment, one or both could be constructed as rear surface mirrors, and therefore be integral with a portion of the associated double-pass component group. In such a case, the benefits of spaced components would be traded for the benefit of fewer separate components to align.

Moreover, while the specific embodiment was optimized for operation at a wavelength of 193 nm, other wavelengths can be accommodated. The indices of refraction of the materials would, of course, be somewhat different at the different wavelength, but the geometric parameters could be easily varied to account for this.

Therefore, the above description should not be taken as limiting the scope of the invention which is defined by the claims.

TABLE 1

|      | RADIUS    | SEPARATION | GLASS            |
|------|-----------|------------|------------------|
| 12   |           | 153.00     |                  |
| 20a  | −173.46   | 34.94      | FUSED SILICA     |
|      | −583.83   | 1.32       |                  |
| 20b  | −612.37   | 33.81      | FUSED SILICA     |
|      | 9348.44   | 52.67      |                  |
| 20c  | −428.30   | 40.93      | CALCIUM FLUORIDE |
|      | −272.31   | 0.07       |                  |
| 20d  | −4463.59  | 84.98      | CALCIUM FLUORIDE |
|      | −307.47   | 366.93     |                  |
| 85   |           | −60.00     | MIRROR           |
| 30   | 1564.95   | −35.09     | FUSED SILICA     |
|      | 763.73    | −349.21    |                  |
| 40   | 1068.80   | 349.21     | MIRROR           |
| 30   | 763.73    | 35.09      | FUSED SILICA     |
|      | 1564.95   | 5.50       |                  |
| 95   |           | 10.03      | APERTURE STOP    |
| 50a  | −166.48   | 22.01      | FUSED SILICA     |
|      | 123.58    | 6.67       |                  |
| 50b  | 433.27    | 16.77      | CALCIUM FLUORIDE |
|      | −194.82   | 0.53       |                  |
| 50c  | 130.16    | 42.24      | CALCIUM FLUORIDE |
|      | −147.54   | 2.90       |                  |
| 50d  | −123.86   | 13.90      | FUSED SILICA     |
|      | 126.71    | 0.06       |                  |
| 50e  | 126.80    | 42.92      | CALCIUM FLUORIDE |
|      | −122.03   | 5.95       |                  |
| 50f  | 152.27    | 39.66      | FUSED SILICA     |
|      | 93.10     | 248.96     |                  |
| 87   |           | 0.00       | MIRROR           |
| 60a  | 1697.31   | −42.98     | CALCIUM FLUORIDE |
|      | 234.64    | −0.03      |                  |
| 60b  | −977.41   | −32.13     | CALCIUM FLUORIDE |
|      | 712.21    | −299.77    |                  |
| 60c  | 292.38    | 22.46      | CALCIUM FLUORIDE |
|      | −41452.45 | 159.75     |                  |
| 70   | 545.98    | 159.75     | MIRROR           |
| 60c  | −41452.45 | 22.46      | CALCIUM FLUROIDE |
|      | 292.38    | 299.77     |                  |
| 60b  | 712.21    | 32.13      | CALCIUM FLUORIDE |
|      | −977.41   | 0.03       |                  |
| 60a  | 234.64    | 42.98      | CALCIUM FLUORIDE |
|      | 1697.31   | 35.00      |                  |
| 80a  | 89.94     | 30.38      | FUSED SILICA     |
|      | 64.79     | 1.94       |                  |
| 80b  | 67.58     | 41.81      | CALCIUM FLUORIDE |
|      | 238.06    | 0.06       |                  |
| 80c  | 119.03    | 7.03       | FUSED SILICA     |
|      | 49.97     | 1.97       |                  |
| 80d  | 48.60     | 24.19      | CALCIUM FLUIRDE  |
|      | 371.17    |            |                  |
| 15   |           | 20.59      |                  |
|      |           | IMAGE      |                  |
| NA = 0.52 |       | REDUCTION = 0.25 X |          |

What is claimed is:

1. A catadioptric reduction projection optical system for producing a reduced image of an object, comprising, in a light path sequence from the object:
   a first lens group;
   a first double-pass component group;
   a first concave mirror;
   said first double-pass component group also being encountered by the light after the light encounters said first concave mirror;
   a second lens group;

said first lens group, said first double-pass component group, said first concave mirror, and said second lens group forming an intermediate image of reduced size at an intermediate image plane;

a second double-pass component group;

a second concave mirror said second double-pass component group also being encountered by the light after the light encounters said second concave mirror; and a third lens group;

said second double-pass component group, said second concave mirror, and said third lens group forming an image of further reduced size at an image plane.

2. The optical system of claim 1 wherein said first lens group is positive.

3. The optical system of claim 1 wherein said second lens group is positive.

4. The optical system of claim 1 wherein said third lens group is positive.

5. The optical system of claim 1 wherein said second double-pass component and said second concave mirror are spaced apart.

6. The optical system of claim 1 wherein all elements are full diameter elements.

7. The optical system of claim 1, wherein all the elements are centered on an optical axis.

8. The optical system of claim 1, and further comprising a folding mirror located between said first lens group and said first double-pass component group.

9. The optical system of claim 1, and further comprising a folding mirror located between said second lens group and said second double-pass component group.

10. The optical system of claim 1, and further comprising a variable aperture stop proximate said second lens group.

11. The optical system of claim 1, and further comprising a field stop proximate said intermediate image plane.

12. The optical system of claim 1, wherein the optical system has a numerical aperture greater than 0.45.

13. The optical system of claim 1, wherein said first concave mirror is spatially separated from said first double-pass component group.

14. A catadioptric reduction projection optical system for producing a reduced image of an object, comprising, in a light path sequence from the object:

means for forming an intermediate image of reduced size at an intermediate image plane;

a double-pass component group;

a concave mirror;

said double-pass component group also being encountered by the light after the light encounters said concave mirror; and a lens group;

said double-pass component group, said concave mirror, and said lens group forming an image of further reduced size at an image plane.

15. A catadioptric reduction projection optical system for producing a reduced image of an object, comprising, in a light path sequence from the object:

a first lens group;

a first double-pass component group;

a first concave mirror;

said first double-pass component group also being encountered by the light after the light encounters said first concave mirror;

a second lens group;

said first lens group, said first double-pass component group, said first concave mirror, and said second lens group forming an intermediate image of reduced size at an intermediate image plane; and means for forming an image of further reduced size at an image plane.

* * * * *

UNITED STATES PATENT AND TRADEMARK OFFICE
CERTIFICATE OF CORRECTION

PATENT NO. : 5,323,263

DATED : June 21, 1994

INVENTOR(S) : Wijnand P. Schoenmakers

It is certified that error appears in the above-identified patent and that said Letters Patent is hereby corrected as shown below:

```
At column 6 of the above-identified issued patent, in Table 1, at
line 40, before "CALCIUM FLUORIDE", please change "22.46" to
"-22.46" and immediately below please change "159.75" to
"-159.75".
```

Signed and Sealed this

Fourth Day of October, 1994

Attest:

BRUCE LEHMAN

*Attesting Officer*    Commissioner of Patents and Trademarks